(12) United States Patent
Fuller et al.

(10) Patent No.: US 7,816,275 B1
(45) Date of Patent: Oct. 19, 2010

(54) GATE PATTERNING OF NANO-CHANNEL DEVICES

(75) Inventors: Nicholas C. M. Fuller, North Hills, NY (US); Sarunya Bangsaruntip, Mount Kisco, NY (US); Guy Cohen, Mohegan Lake, NY (US); Sebastian U. Engelmann, White Plains, NY (US); Lidija Sekaric, Mount Kisco, NY (US); Qingyun Yang, Poughkeepsie, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/417,954

(22) Filed: Apr. 3, 2009

(51) Int. Cl.
*H01L 21/00* (2006.01)

(52) U.S. Cl. .................. 438/745; 438/694; 438/197; 257/E21.001; 977/938; 977/762

(58) Field of Classification Search ............ 438/585, 438/589, 197, 694, 696, 745; 257/E21.001, 257/E21.158; 977/762, 938
See application file for complete search history.

(56) References Cited

U.S. PATENT DOCUMENTS

| 6,709,929 | B2 | 3/2004 | Zhang et al. | |
|---|---|---|---|---|
| 2005/0230356 | A1* | 10/2005 | Empedocles et al. | 217/2 |
| 2007/0228491 | A1 | 10/2007 | Forbes | |
| 2007/0232007 | A1 | 10/2007 | Forbes | |
| 2008/0045011 | A1 | 2/2008 | Fuller et al. | |
| 2008/0248642 | A1* | 10/2008 | Crowder et al. | 438/593 |
| 2010/0038627 | A1* | 2/2010 | Parikh et al. | 257/24 |

OTHER PUBLICATIONS

U.S. Appl. No. 11/760,992, filed Jun. 11, 2007, entitled, "Multi-Layer Mask Method for Patterned Structure Etching," First Named Inventor: Nicholas Fuller.
U.S. Appl. No. 11/860,459, filed Sep, 24, 2007, entitled, "Methods of Manufacture of Vertical Nanowire FET Devices and FET Devices Produced Thereby," First Named Inventor: Hariklia Deligianni.

* cited by examiner

*Primary Examiner*—Matthew Smith
*Assistant Examiner*—Michele Fan
(74) *Attorney, Agent, or Firm*—Scully, Scott, Murphy & Presser, P.C.; Daniel P. Morris, Esq.

(57) ABSTRACT

Methodologies and gate etching processes are presented to enable the fabrication of gate conductors of semiconductor devices, such as NFETs and/or PFETs, which are equipped with nano-channels. In one embodiment, a sacrificial spacer of equivalent thickness to the diameter of the gate nano-channel is employed and is deposited after patterning the gate conductor down to the gate dielectric. The residue gate material that is beneath the nano-channel is removed utilizing a medium to high density, bias-free, fluorine-containing or fluorine- and chlorine-containing isotropic etch process without compromising the integrity of the gate. In another embodiment, an encapsulation/passivation layer is utilized. In yet further embodiment, no sacrificial spacer or encapsulation/passivation layer is used and gate etching is performed in an oxygen and nitrogen-free ambient.

18 Claims, 15 Drawing Sheets

GATE PATTERNING OF NANO-CHANNEL DEVICES

FIELD OF THE INVENTION

The present invention generally relates to semiconductor integrated circuits (ICs), and more particularly to complementary metal oxide semiconductor (CMOS) n-type field effect transistors (nFETs) and p-type field effect transistors (pFETs) with nano-sized channel lengths in which various processes are utilized for patterning the gate of the CMOS devices that enable the removal of residue gate material beneath the nano-channel without compromising the integrity of the gate.

BACKGROUND OF THE INVENTION

Generally, semiconductor devices include a plurality of circuits that form an integrated circuit (IC) including semiconductor chips, thin film packages and printed circuit boards. ICs can be useful for computers and electronic equipment and can contain millions of transistors and other circuit elements that are fabricated on a single semiconductor (e.g., Si) crystal substrate.

For complementary metal oxide semiconductor (CMOS) devices to be functional, the gates of each nFET and each pFET, which are typically comprised of polysilicon and a dielectric material having a dielectric constant greater than silicon dioxide (herein after "high k dielectric"), must be patterned without compromising the integrity of the gate material and the gate dielectric(s). For 15 nm node and beyond technologies, several device options are being contemplated, some of which entail the use of nano-channel devices to increase the carrier mobility and device performance, reduce the short channel effect, and to increase the scalability. The term "nano-channel" refers to a device whose channel diameter is on the order of about 50 nm or less.

Nano-channel devices typically, but not necessarily always, include nanowires (NWs) made of a semiconductor material including, for example, Si, SiGe, a III-V compound semiconductor, or a carbon nanotube (CNT) for use in the active channel area. Such nano-channels could be patterned with a conventional "top down" lithographic patterning technique or from a "bottom up" process with NW or CNT deposition atop a semiconductor substrate, e.g., Si, SiGe, a silicon-on-insulator (SOI) or a silicon germanium-on-insulator (SGOI) followed by conventional gate patterning such as those outlined in U.S. application Ser. No. 11/760,992, filed Jun. 11, 2007 and U.S. Patent Application Publication No. 2008/0045011-A1, publication date Feb. 21, 2008 or other prior art methodologies.

Irrespective of the employed methodology for fabricating the gate conductor, the use of a nano-channel material implies that conventional prior art plasma etching processes typically employed for patterning the latter will encounter some limitation during the etching process. This limitation entails difficulty in removing residue gate material that is beneath the nano-channel without compromising the integrity of the gate material as the isotropic etching process employed for removing the gate material will also etch some fraction of the gate conductor.

In view of the above, there is a need for providing a method of fabricating a nano-channel semiconductor device in which the patterning of the gate of the semiconductor device removes residue gate material beneath the nano-channel without compromising the integrity of the gate.

SUMMARY OF THE INVENTION

The present invention provides a semiconductor device, e.g., a CMOS device, comprised of a nano-channel wherein the gate of the semiconductor device is patterned by processes that ensure the complete removal of residue gate material beneath the nano-channel without compromising the integrity of the gate. In some embodiments of the invention, an etch process is utilized that facilitates the complete removal of residual gate material beneath the nano-channel while simultaneously and isotropically etching (i.e., trimming) the gate to its target dimension in a uniform fashion along the z-axis and thus not compromising the gate's integrity.

The present invention also provides a semiconductor device, e.g., CMOS device, enabling higher speed circuits and ring oscillators.

The present invention further provides a semiconductor device, e.g., CMOS device, in which a bias-free, fluorine or fluorine and chlorine-containing etch chemistry is employed to isotropically etch the residue gate material beneath the nano-channel selective to an employed sacrificial spacer and without compromising the gate integrity.

The present invention also provides a semiconductor device, e.g., CMOS device, in which the thickness of the sacrificial spacer employed is equal to the diameter of the nano-channel.

In one embodiment of the present invention, the aforementioned semiconductor devices are provided using a sacrificial spacer material comprised of a spin-on or chemically deposited SiN, SiON, $SiO_2$, SiC, SiCN, SiCNH or SiCOH material (collectively referred to herein as a Si-containing material), the thickness of which is equivalent to the diameter of the nano-channel. The sacrificial spacer employed in the invention is deposited and etched after the gate has been etched, but without performing the last step of the etch process, namely the isotropic etch that ensures removal of residue gate material beneath the nano-channel.

Once the spacer is in place, one may invoke the final stage of the gate etch process, namely an isotropic etch process capable of etching the residue gate material selective to the spacer and gate dielectric. Since the thickness of the spacer is equivalent to the diameter of the nano-channel, as the residue gate material beneath the latter is removed, a similar lateral etch process but in the orthogonal direction (parallel to the nano-channel and beneath both nano-channel and the spacer) occurs removing all residue gate material without compromising the integrity of the gate.

Once the lateral etch rate of the gate material in the employed etch chemistry is known, one can employ this last stage of the gate etching process for a fixed time (given the dimensions of the nano-channel and spacer) to ensure all of the residue gate material is removed beneath the nano-channel without compromising the gate integrity. This isotropic etch process is conducted on the same medium to high density plasma reactor as that used for the prior etching stages of the gate conductor, namely: inductively coupled, dual capacitively coupled, microwave, electron cyclotron resonance, helicon, or helical resonator.

An example of specific inventive plasma conditions employed for the isotropic etch process in the invention includes, but is not limited to pressures greater than or equal to 30 mT, negligible or no substrate bias, source powers greater than or equal to 150 W (plasma density typically between $10^{10}$ $cm^{-3}$ to $10^{12}$ $cm^{-3}$), F-containing or F and Cl-containing chemistries, respectively including $SF_6$, $CF_4$, $CHF_3$, $CH_2F_2$, $C_2F_6$, $C_4F_6$, $C_4F_8$, $C_5F_8$, or combinations thereof and $Cl_2$, $BCl_3$, or combinations thereof, with $SF_6/CF_4$ and Cl$_2$ chemistries being preferred. The spacer, which does not etch at an appreciable rate in an etch process employing the above conditions, thus serves as a buffer impeding removal of the residue gate material beneath the nano-channel in close proximity to the gate. At this stage, the sacrificial spacer is removed by prior art wet or dry chemistries to complete the gate patterning process.

In another embodiment of the invention, the aforementioned semiconductor devices are provided utilizing a sidewall encapsulation and passivation process. The sidewall encapsulation and passivation process is employed in the invention after the gate has been etched, but without performing the last step of the etch process, namely the isotropic etch that ensures removal of residue gate material beneath the nano-channel.

In this embodiment of the invention, sidewalls of at least a patterned gate conductor, which is located atop semiconductor nanowires that are surrounded by a gate dielectric, are subjected to a passivation process, such as a thermal oxidation or nitridation process, in which a thin (on the order of 5 nm or less) passivation layer is formed on the gate sidewalls. After gate sidewall passivation, a second application of a gate resist mask with a larger resist area thus encapsulating the gate and passivation layer is utilized to protect the patterned gate conductor including the passivated sidewalls. A two-step etching process is then performed. The first is a non-directional etch that removes the passivation layer that formed on the residue gate material that is located beneath the semiconductor nanowires. The second etch includes a selective and isotropic etching process as described above to remove the residue gate material that is present beneath the semiconductor nanowires and thereafter the second gate resist mask is stripped from the structure.

In one aspect of the present invention and in general terms, the embodiments mentioned above which include the use of either a sacrificial spacer or an encapsulating/passivation layer include the steps of:

providing at least one patterned gate conductor atop semiconductor nanowires that are surrounded by a gate dielectric, wherein residue gate material is present beneath the semiconductor nanowires;

forming a protective material, e.g., sacrificial spacer or sidewall encapsulation and passivation layer, on at least exposed sidewalls of said at least one patterned gate conductor; and selectively removing the residue gate material that is present beneath the semiconductor nanowires utilizing an isotropic etching process.

In addition to the embodiments mentioned above which include the use of either a sacrificial spacer or an encapsulating/passivation layer, the present invention also provides a method in which the gate patterning of a nano-channel device is achieved without the need for utilizing either a sacrificial spacer or an encapsulating/passivation layer. This particular embodiment of the present invention provides a more efficient and cost efficient means for gate patterning of nano-channel devices as compared to prior art processes.

In the embodiment of the invention not including a sacrificial layer or an encapsulating/passivation layer, an etch process is employed that facilitates the complete removal of residual gate material beneath the nano-channel while simultaneously and isotropically etching (i.e., trimming) the gate to its target dimension in a uniform fashion along the z-axis and thus not compromising the gate's integrity. Specifically, this embodiment of the present invention provides a semiconductor device, e.g., a CMOS device, in which oxygen and nitrogen-free chemistry is employed to etch the gate to its target depth followed by the above-mentioned fluorine-containing plasma etch.

The absence of oxygen and nitrogen species during the gate etch impedes the formation of a passivating layer containing oxygen or nitrogen. Such a layer is typically non-uniform and, as such, during subsequent etching steps during which the gate material beneath the nano-channel is removed, the passivating layer is also removed in a non-uniform manner leading to differing lateral etch extents at various locations along the z-axis of the gate. This effect can be eliminated with oxygen and nitrogen-free etch chemistries as the gate is etched to its target critical dimension.

At this stage of the etch process, an isotropic etch process is applied to removed the gate material beneath the nano-channel. Since there is no passivation layer protecting the gate, the gate itself is also etched simultaneously in a uniform manner along the z-axis. For this embodiment of the present invention, the initial gate dimension is larger than the target gate dimension such that the volume of gate material to be removed beneath the nano-channel is quasi-equivalent to the volume of gate material to be etched in the actual gate structure to achieve the target critical dimension of this electrode. The isotropic etch process in this embodiment of the invention is conducted on the same medium to high density plasma reactor as that used for the prior etching stages of the gate conductor, namely: inductively coupled, dual capacitively coupled, microwave, electron cyclotron resonance, helicon, or helical resonator.

An example of specific inventive plasma conditions employed for the isotropic etch process of this embodiment of the invention includes, but is not limited to pressures greater than or equal to 30 mT, negligible or no substrate bias, source powers greater than or equal to 150 W (plasma density typically between $10^{10}$ cm$^{-3}$ to $10^{12}$ cm$^{-3}$), F-containing chemistries, respectively including SF$_6$, CF$_4$, XeF$_2$, or combinations thereof.

In one aspect of the present invention and in general terms, the embodiment of the invention including no sacrificial spacer and encapsulation/passivation layer includes:

providing at least one patterned gate conductor of a first dimension atop semiconductor nanowires that are surrounded by a gate dielectric, wherein residue gate material is present beneath the semiconductor nanowires and said providing the at least one gate conductor includes etching in an oxygen and nitrogen-free ambient; and selectively removing the residue gate material that is present beneath the semiconductor nanowires utilizing an isotropic etching process while simultaneously etching the at least one patterned gate conductor to a second dimension that is smaller than the first dimension in a uniform manner.

In some embodiments in which etching is performed without a sacrificial spacer and an encapsulation/passivation layer, an upper portion of the at least one patterned gate conductor is predoped prior to etching. Utilizing a predoped gate conductor enhances the removal of the upper portion of the gate conductor during the etching process.

In another aspect of the invention, a semiconductor structure is provided that includes:

a semiconductor substrate;

semiconductor nanowires located atop the semiconductor substrate and are surrounded by a gate dielectric; and at least one patterned gate conductor located atop the semiconductor nanowires, wherein no residue gate material is present beneath the semiconductor nanowires and there is no consumption (below or above) of the at least one patterned gate conductor.

BRIEF DESCRIPTION OF THE DRAWINGS

FIG. 1A is a pictorial representation (through a cross sectional view) illustrating an initial structure that can be employed in a first embodiment of the invention, while

FIG. 2A is a pictorial representation (through a cross sectional view) illustrating the structure of FIG. 1A after gate etching and resist stripping, while

FIG. 3A is a pictorial representation (through a cross sectional view) illustrating the structure of FIG. 2A after sacrificial spacer formation, while

FIG. 4A is a pictorial representation (through a cross sectional view) illustrating the structure of FIG. 3A after isotropic etching to remove gate material from beneath semiconductor nanowires, while

FIG. 5A is a pictorial representation (through a cross sectional view) illustrating the structure of FIG. 4A after removing the sacrificial spacer from the structure, while

FIG. 6A is a pictorial representation (through a cross sectional view) illustrating an initial structure that can be employed in a second embodiment of the invention, while

FIG. 7A is a pictorial representation (through a cross sectional view) illustrating the structure of FIG. 6A after gate etching and resist stripping, while

FIG. 8A is a pictorial representation (through a cross sectional view) illustrating the structure of FIG. 7A after gate sidewall passivation, while

FIG. 9A is a pictorial representation (through a cross sectional view) illustrating the structure of FIG. 8A after a second application of a gate resist mask, while

FIG. 10A is a pictorial representation (through a cross sectional view) illustrating the structure of FIG. 9A after lateral gate conductive trimming, while

FIG. 11A is a pictorial representation (through a cross sectional view) illustrating the structure of FIG. 10A after resist removal, while

FIG. 12A is a pictorial representation (through a cross sectional view) illustrating an initial structure including an optionally predoped gate conductor that can be employed in a third embodiment of the invention, while

FIG. 13A is a pictorial representation (through a cross sectional view) illustrating the structure of FIG. 12A post lithography, while

FIG. 14A is a pictorial representation (through a cross sectional view) illustrating the structure of FIG. 13A after gate etching utilizing no oxygen and nitrogen species, e.g., after performing a breakthrough etch, while

FIG. 15A is a pictorial representation (through a cross sectional view) illustrating the structure of FIG. 14A after isotropic etching and performing a wet etch to clean the structure, while

DETAILED DESCRIPTION OF THE INVENTION

The present invention, which provides methods of gate patterning nano-channel devices, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As indicated above, the present invention provides methods for patterning the gate of a nano-channel device that enable complete removal of residue gate material beneath the nano-channel without compromising the integrity of the gate. In one embodiment of the present invention, a sacrificial spacer process is employed to pattern the gate of a nano-channel device. This embodiment of the present invention is illustrated in FIGS. 1A-5B. In another embodiment of the present invention, a gate sidewall encapsulation and passivation process is used in patterning the gate of a nano-channel device. This particular embodiment is shown in FIGS. 6A-11B. In yet a further embodiment of the present invention, an oxygen and nitrogen-free etching ambient is used to etch a gate conductor that does not include any sacrificial spacer and encapsulation/passivation layer. This particular embodiment of the present invention is shown in FIGS. 12A-15B.

Figure 1A:
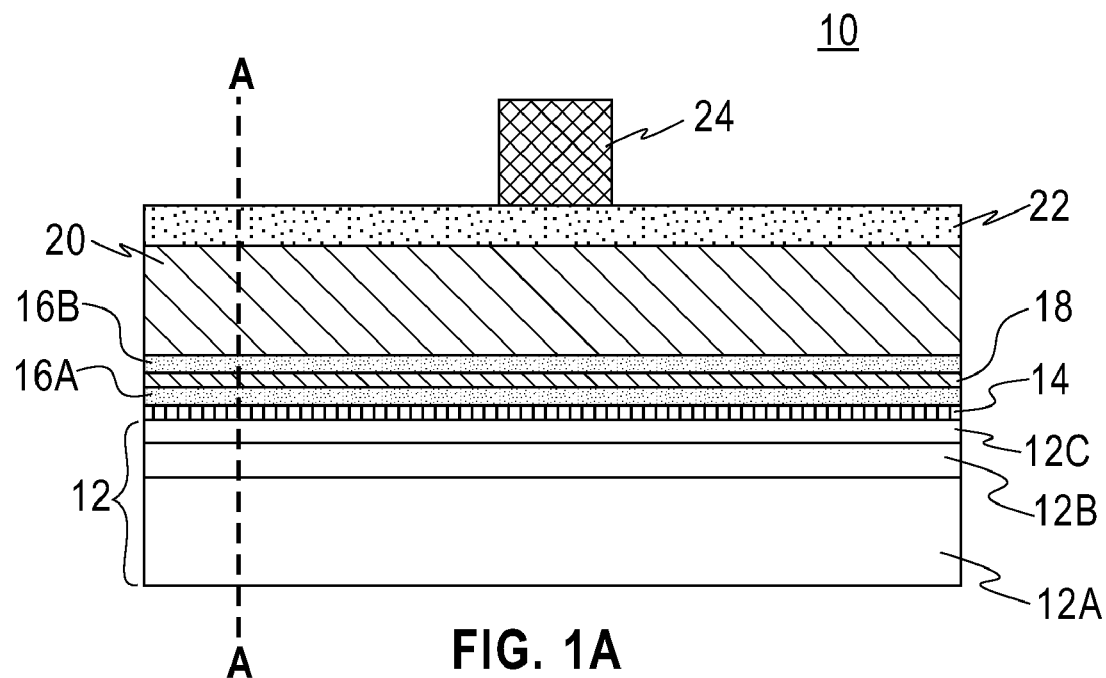
Figure 1B:
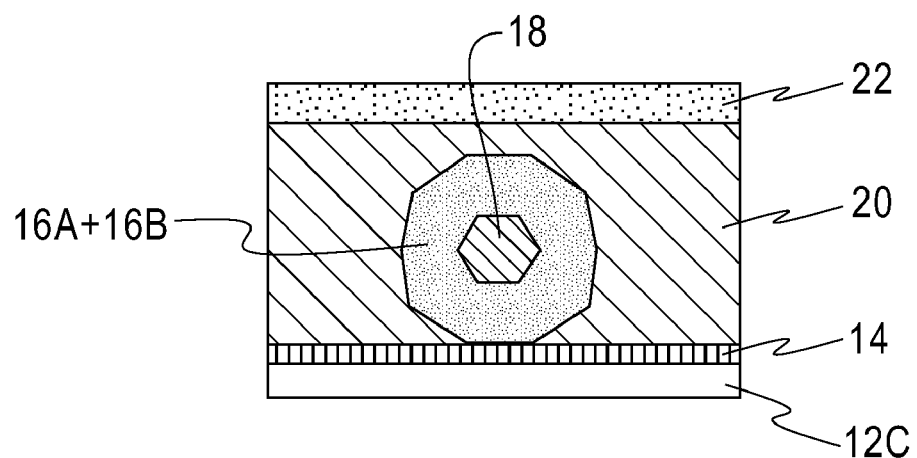
FIG. 1B is an orthogonal view through line A-A shown in FIG. 1A.

Specifically, and in respect to the sacrificial spacer embodiment, the inventive process of this embodiment of the invention begins by providing the initial structure 10 whose cross sectional view is shown in FIG. 1A; FIG. 1B is an orthogonal view of the structure shown in FIG. 1A through A-A. The initial structure 10 includes a semiconductor substrate 12 having an insulator layer 14 located on the surface thereof. The initial structure 10 shown in FIGS. 1A-1B further includes semiconductor nanowires 18. The semiconductor nanowires 18 are illustrated as a layer that is surrounded by a gate dielectric, depicted as a lower gate dielectric 16A and an upper gate dielectric 16B. A gate conductor 20 and a gate hard mask 22 are located atop the upper gate dielectric 16B. The initial structure 10 shown in FIG. 1A further includes a patterned photoresist 24 located atop a surface of the gate hard mask 22.

The initial structure 10 shown in FIGS. 1A-1B is comprised of materials well known to those skilled in the art and conventional processes that are also well known to those skilled in the art can be employed in providing the initial structure 10.

For example, the semiconductor substrate 12 of the initial structure 10 may be comprised of a semiconductor-on-insulator substrate that includes a handle substrate 12A, a buried insulating layer 12B and a semiconductor layer 12C. The semiconductor-on-insulator substrate can be formed utilizing well known techniques including, for example, wafer bonding, lamination, or SIMOX (separation by ion implantation of oxygen). The handle substrate 12A and the semiconductor layer 12C may be comprised of the same or different semiconductor materials. Examples of suitable semiconductor materials that can be employed as the handle substrate 12A and the semiconductor layer 12C include, but are not limited to Si, SiGe, SiC, SiGeC, Ge, GaAs, GaN, InAs, InP and other III/V or II/VI compound semiconductors. The buried insulating layer 12B may be comprised of a crystalline or non-crystalline oxide, nitride, and/or oxynitride, with crystalline oxides being highly preferred. The various thicknesses of layers 12A, 12B and 12C are within ranges that are typically mentioned in the art for such layers of a semiconductor-on-insulator substrate. For example, the thickness of handle substrate 12A may be from 200 microns to 600 microns, the thickness of layer 12B may be from 100 nm to 180 nm, and the thickness of layer 12C may be from 60 nm to 110 nm.

In some embodiments of the present invention, semiconductor substrate 12 is a bulk semiconductor substrate (absent layers 12A, 12B and 12C) including one of the aforementioned semiconductor materials.

After providing the semiconductor substrate 12, an insulator layer 14 is typically, but not necessarily always formed on the surface of the substrate 12. The insulator layer 14 may be comprised of a semiconductor oxide, a semiconductor nitride, a semiconductor oxynitride or a nitrided semiconductor oxide. In one embodiment of the invention, the insulator layer 14 is a silicon oxide. The thickness of the insulator layer 14 is typically from 0.5 nm to 1.5 nm, with a thickness from 0.8 nm to 1.2 nm being even more typical. The thickness of the insulator layer 14, however, may be different after processing at higher temperatures, which are typically used during CMOS fabrication.

The insulator layer 14 may be formed utilizing a conventional deposition technique well known to those skilled in the art including, but not limited to chemical vapor deposition (CVD), plasma enhanced chemical vapor deposition (PECVD) and atomic layer deposition (ALD). In some embodiments of the invention, the insulator layer 14 may be formed by a thermal growth process including, but not limited to thermal oxidation and thermal nitridation.

Next, semiconductor nanowires 18 that are surrounded by a gate dielectric, depicted as a lower gate dielectric 16A and an upper gate dielectric 16B are formed utilizing conventional techniques well known to those skilled in the art. Specifically, and in one embodiment of the invention, the semiconductor nanowires (NWs) 18 can be made with conventional "top down" patterning methodologies including epitaxial growth of a semiconductor material, lithography to define NW dimensions followed by various types of plasma etching to define the NWs in the semiconductor material using specific masking layers. The NWs can be further "thinned" using oxidative thinning combined with removal of the oxide layer that forms using a wet etching process (such as etching in HF). In another embodiment of the invention, the NWs 18 can be made using a "bottom up" approach employing an appropriate metal catalyst (Au, Fe, Ti, Ga), precursors, and relevant dopants (e.g., Si, silane ($SiH_4$), phosphine ($PH_3$) and diborane ($B_2H_6$)) and processed/deposited using CVD, PECVD, laser ablation or an evaporation technique.

The gate dielectric that surrounds the NWs 18 is formed by an atomic layer deposition process or other like deposition process.

The semiconductor nanowires 18 employed in the present invention may comprise a semiconductor material including those mentioned above for handle substrate 12A and semiconductor layer 12C. Typically, the semiconductor nanowires 18 are comprised of a Si-containing semiconductor, with Si nanowires being highly preferred in some embodiments of the invention. The semiconductor nanowires 18 that are employed in the present invention have a length that is less than 350 nm, typically less than 100 nm. The diameter of the NWs ranges from 10 nm to 50 nm and after oxidative "thinning" less than or equal to 10 nm, preferably from 5 nm to 10 nm and are typically separated by a distance of 50 nm to 100 nm.

The gate dielectric that surrounds the semiconductor nanowires may comprise any dielectric material including, but not limited to silicon dioxide, silicon nitride and silicon oxynitride. In addition to these dielectric materials, the gate dielectric that surrounds the semiconductor nanowires may include a high k dielectric material (e.g., k greater than silicon dioxide) such as, for example, $TiO_2$, $Al_2O_3$, $HfO_2$, $ZrO_2$, $Ta_2O_5$, $La_2O_3$ and other like metal oxides including perovskite type oxides. In addition to the above gate dielectric materials, the present invention also contemplates instances when TiN and TaN are used. The gate dielectric that surrounds the semiconductor nanowires has a total thickness from 1 nm to 20 nm, with a total thickness from 2 nm to 10 nm being even more typical.

Next, a gate conductor 20 is formed atop the gate dielectric utilizing a conventional deposition process including, but not limited to physical vapor deposition (PVD), CVD or evaporation. The gate conductor 20 is comprised of any suitable conductive material including, but not limited Si-containing materials such as Si or SiGe alloy in single crystal, polycrystalline or amorphous form. The gate conductor 20 may also be comprised of a conductive metal or a conductive metal alloy (TiN, TaN etc). Combinations of the aforementioned conductive materials are also contemplated in the present invention. In some embodiments of the invention, the gate conductor 20 is comprised of a Si-containing material, with polySi being highly preferred.

The thickness of the gate conductor 20 may vary depending on the technique used to form the same and the material of the gate conductor. Typically, the thickness of the gate conductor 20 is from 50 nm to 200 nm, with a thickness from 30 nm to 100 nm being even more typical.

Next, a gate hard mask 22 is formed atop the gate conductor 20 utilizing a conventional deposition process including, but not limited to CVD, PECVD, PVD and evaporation. The gate hard mask 22 is comprised of an oxide, nitride, oxynitride or a multilayered stack thereof. In one embodiment, the gate hard mask 22 is comprised of silicon dioxide. In another embodiment of the invention, the gate hard mask 22 is comprised of a multilayered stack comprising a lower silicon dioxide layer and an upper silicon nitride layer.

The thickness of the gate hard mask 22 may vary depending on the technique used to form the same as well as the material of the hard mask itself. Typically, the gate hard mask 22 has a thickness from 15 nm to 100 nm, with a thickness from 20 nm to 50 nm being even more typical.

After forming the gate hard mask 22 atop the gate conductor 20, a patterned photoresist 24 having a gate pattern is formed atop the gate hard mask 22. The patterned photoresist 24 is formed by first providing a blanket layer of photoresist material atop the gate hard mask 22 utilizing a conventional deposition process such as, for example, spin-on coating. Next, the blanket layer of photoresist material is exposed to a pattern of radiation and then the exposed photoresist material is developed utilizing a conventional developer well known to those skilled in the art. A conventional resist trimming process may also be used to thin the width of the patterned resist.

After providing the initial structure 10 shown in FIGS. 1A-1B, the gate hard mask 22 and the gate conductor 20 are patterned forming a patterned gate hard mask 22' and a patterned gate conductor 20' atop the semiconductor nanowires 18 that are surrounded by the gate dielectric. The patterning of the gate hard mask 22 and the gate conductor 20 is performed by utilizing one or more etching steps. The one or more etching steps include dry etching (i.e., reactive ion etching, plasma etching, ion beam etching or laser ablation) and/or wet chemical etching. Typically, two etching steps are employed, the first of which transfers the pattern from the patterned photoresist 24 to the underlying gate hard mask 22, and the second of which transfers the pattern from the now patterned gate hard mask 22' to the underlying gate conductor 20.

The at least one patterned gate conductor has an effective gate length from 20 nm to 25 nm, which is maintained even after the final etching process. Moreover, each patterned gate conductor within the structure is typically separated from its nearest identical neighbor by a distance from 70 nm to 80 nm.

Figure 2A:
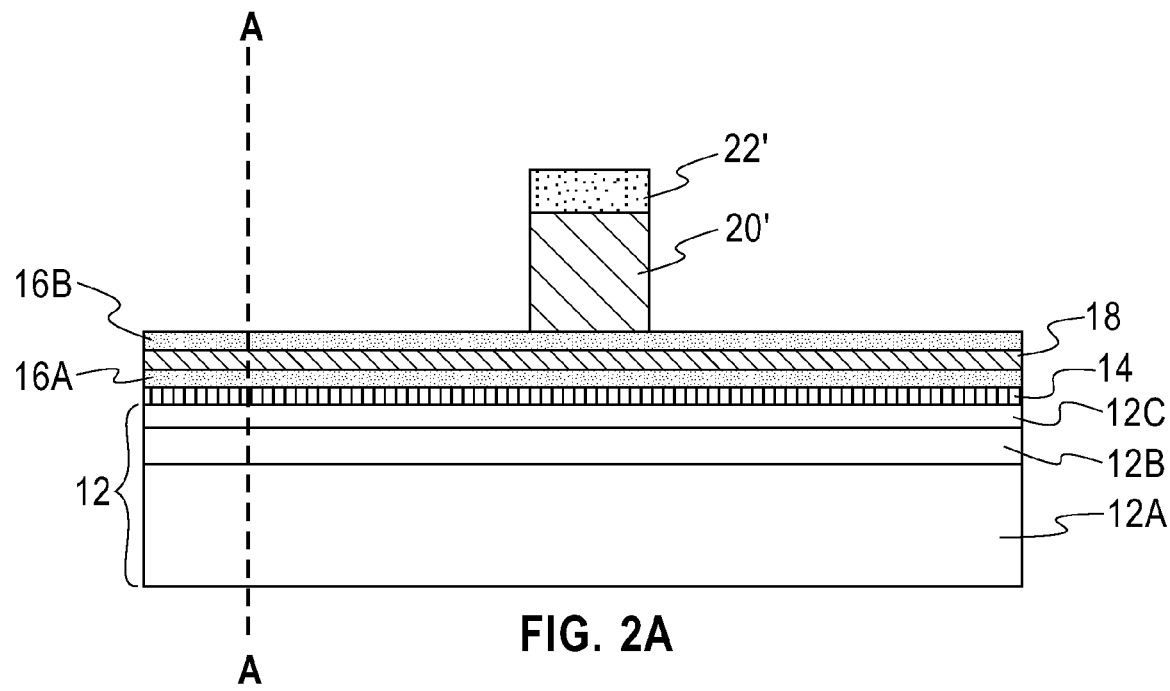
Figure 2B:
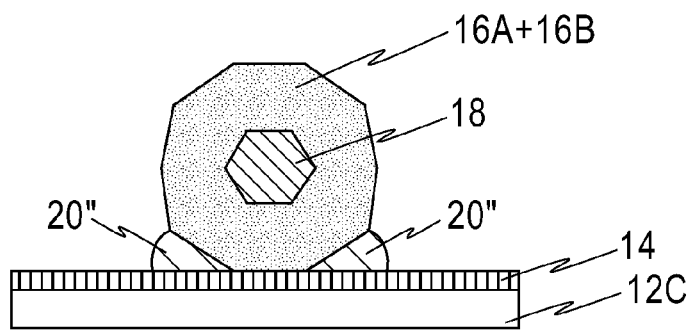
FIG. 2B is an orthogonal view through line A-A shown in FIG. 2A.

The patterned photoresist 24 can be removed immediately after transferring the pattern into the hard mask material or it can be removed after the pattern has been transferred to the underlying gate conductor 20. A conventional resist stripping process such as, for example, ashing, can be employed in removing the patterned photoresist 24 from the structure. The resultant structure that is formed after patterning of the gate hard mask and the gate conductor and removing the patterned photoresist is shown in FIGS. 2A-2B. It is observed that after the aforementioned etching step, some of the gate conductor material remains beneath the semiconductor nanowires 18. The remaining gate conductor material is designated as 20" in FIG. 2B.

The remaining gate conductor material 20" may also be referred to herein as a residue or stringer. The stringers 20" are connected to the patterned gate conductor 20'. If left within the structure, the stringers 20" can lead to electrical shorts between the NWs 18 and the patterned gate conductor 20' when contacts (e.g., source and drain contacts) are formed to the body of each NW 18. As such, the stringers 20" need to be removed before the contacts are made to the body of each NW 18.

At this point of the inventive process, an ion implantation process is typically performed to change the etch rate of the stringers 20". It is noted that the etch rate of the stringers 20" that are implanted with ions is substantially higher than that of the same material without being implanted. For example, the etch rate of ion implanted poly-silicon could be four times higher than that of a non-implanted poly-silicon. The ion-energy employed in the ion implantation step is chosen such that the ions are implanted at a depth roughly equal half of the stringers 20" thickness. Since the stringers 20" thickness is typically small (e.g., a few nanometers), the ions mostly change the property of the stringers 20", but do not affect the patterned gate conductor 20' properties since the ions end up being stopped by the patterned gate hard mask 22'. The ion used could be dopants such as boron (for p-type) or phosphorus (for n-type) in the example of poly-silicon gate conductor. Alternatively, neutral ions such as silicon can also be implanted.

Figure 3A:
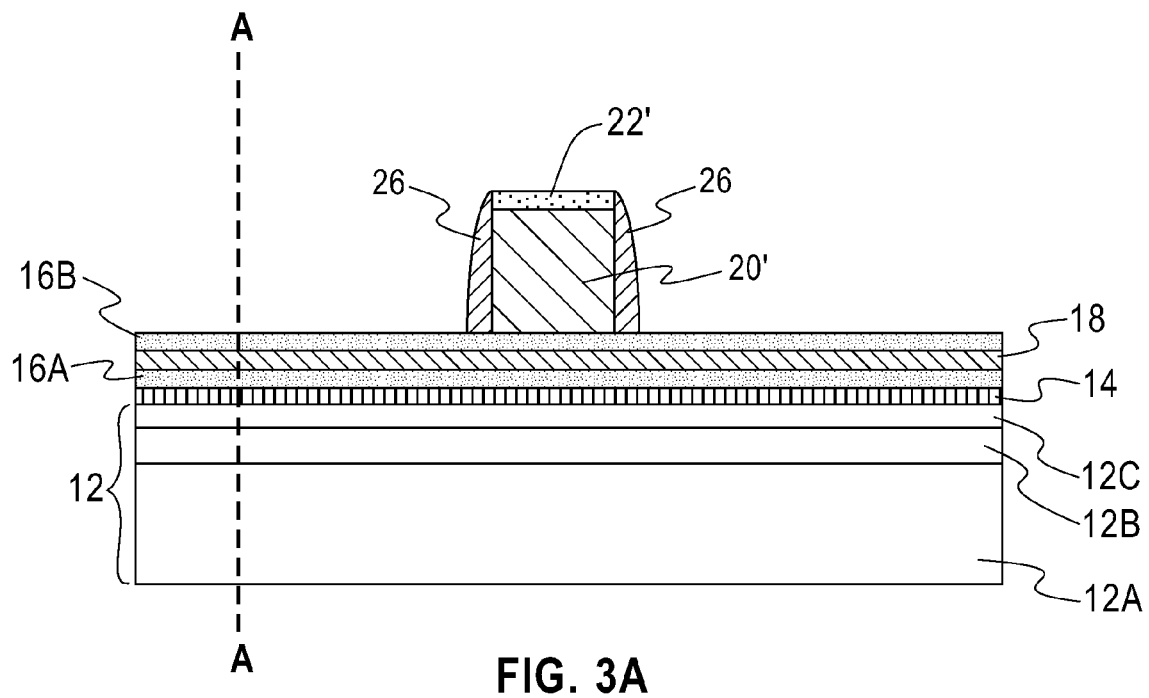
Figure 3B:
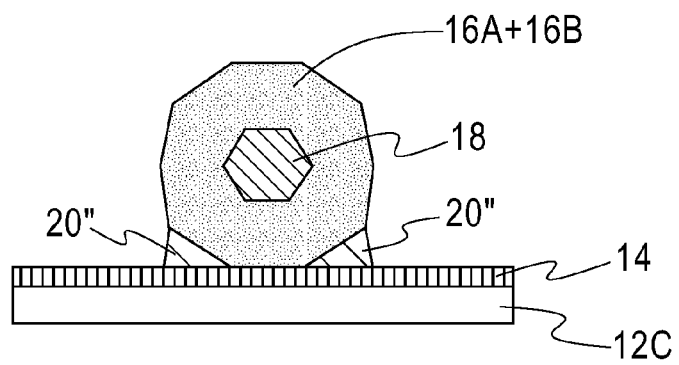
FIG. 3B is an orthogonal view through line A-A shown in FIG. 3A.

Next, and as shown in FIGS. 3A-3B, a sacrificial spacer 26 is formed of the sidewalls of at least the patterned gate conductor 20'. In some embodiments, the sacrificial spacer 26 can also be formed on the sidewalls of the patterned gate hard mask 22'.

The sacrificial spacer 26 is formed by a spin-on deposition process or by a chemical deposition process, followed by etching. The sacrificial spacer 26 is comprised of SiN, SiON, $SiO_2$, SiCN, SiCNH or SiCOH material. The thickness of the sacrificial spacer 26 is equivalent to the diameter of the nano-channel, i.e., the diameter of an individual nanowire. The etching used in this step of the present invention includes a dry etching process or a chemical wet etch process. It is however noted that this etching process is not sufficiently isotropic and as such it does not remove the stringers 20" that are located beneath the NWs 18.

Figure 4A:
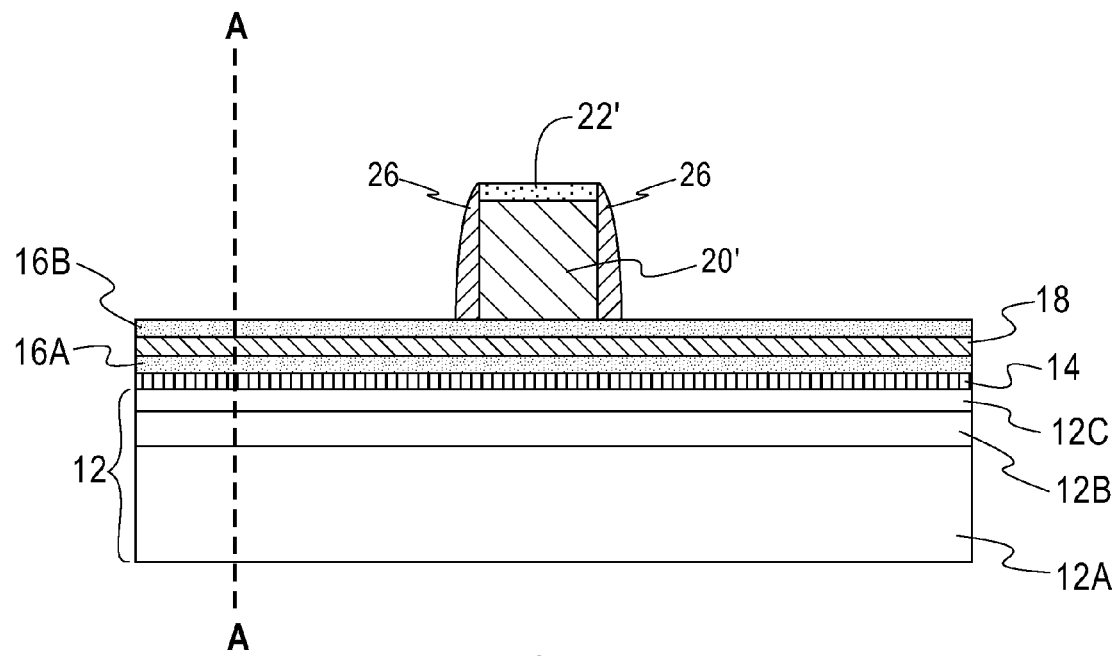
Figure 4B:
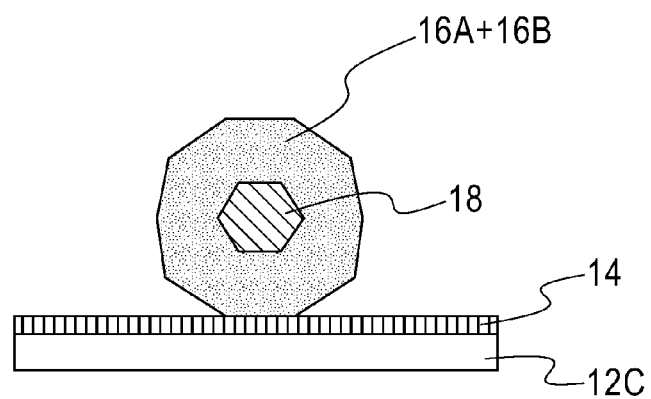
FIG. 4B is an orthogonal view through line A-A shown in FIG. 4A.

Next, an isotropic etch process (i.e., lateral etching) that is capable of etching the stringers 20" (i.e., the gate material that forms under the nanowires during patterning of the gate conductor) selective to the sacrificial spacer 26 and gate dielectric is employed to provide the structure illustrated in FIGS. 4A-4B. Since the thickness of the sacrificial spacer 26 is equivalent to the diameter of the nano-channel, as the stringers 20" beneath the later is removed, a similar lateral etch process but in the orthogonal direction (parallel to the nano-channel and beneath both nano-channel and the spacer) occurs removing all residue gate material without compromising the integrity of the gate.

Once the lateral etch rate of the gate material in the employed etch chemistry is known, one can employ this last stage of the gate etching process for a fixed time (given the dimensions of the nano-channel and spacer) to ensure all of the residue gate material is removed beneath the nano-channel without compromising the gate integrity. This isotropic etch process is conducted on the same medium to high density plasma reactor as that used for the prior etching stages of the gate conductor, namely: inductively coupled, dual capacitively coupled, microwave, electron cyclotron resonance, helicon, or helical resonator.

An example of specific inventive plasma conditions employed for the isotropic etch process in the invention includes, but is not limited to pressures greater than or equal to 30 mT, negligible or no substrate bias, source powers greater than or equal to 150 W (plasma density typically between $10^{10}$ $cm^{-3}$ to $10^{12}$ $cm^{-3}$), F-containing or F and Cl-containing chemistries, respectively including $SF_6$, $CF_4$, $CHF_3$, $CH_2F_2$, $C_2F_6$, $C_4F_6$, $C_4F_8$, $C_3F_8$, or combinations thereof and $Cl_2$, $BCl_3$, or combinations thereof, with $SF_6/CF_4$ and $Cl_2$ chemistries being preferred. The sacrificial spacer 26, which does not etch at an appreciable rate in an etch process employing the above conditions, thus serves as a buffer impeding removal of the residue gate material (e.g., stringer 20") beneath the nano-channel in close proximity to the gate.

Figure 5A:
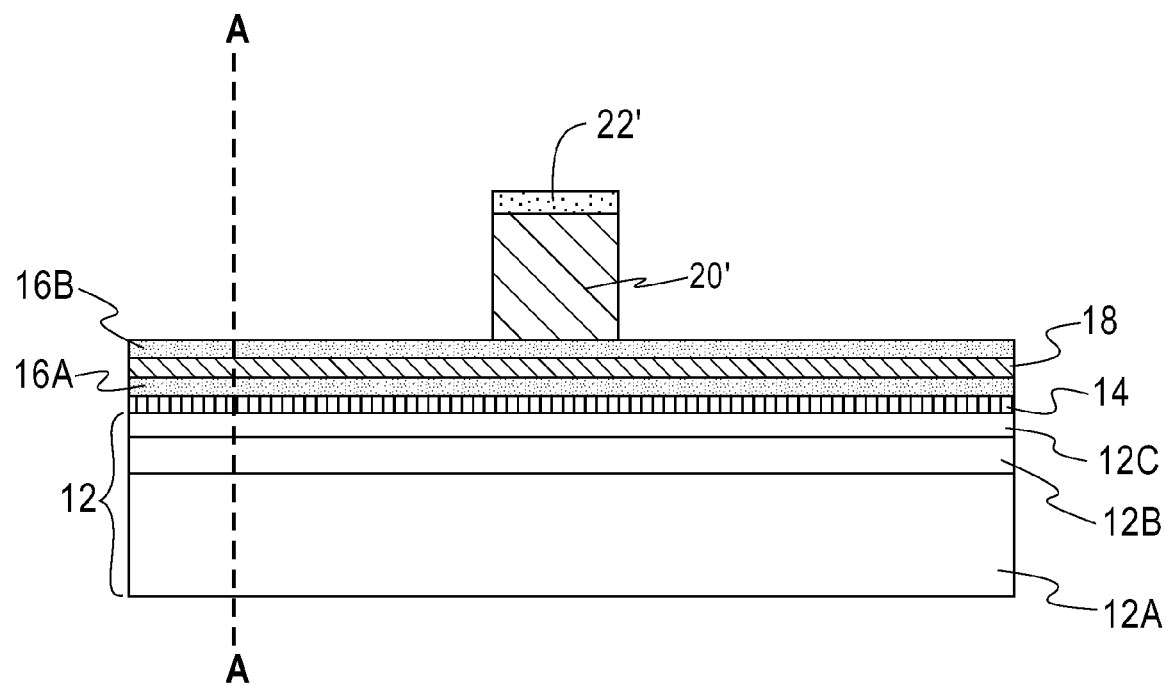
Figure 5B:
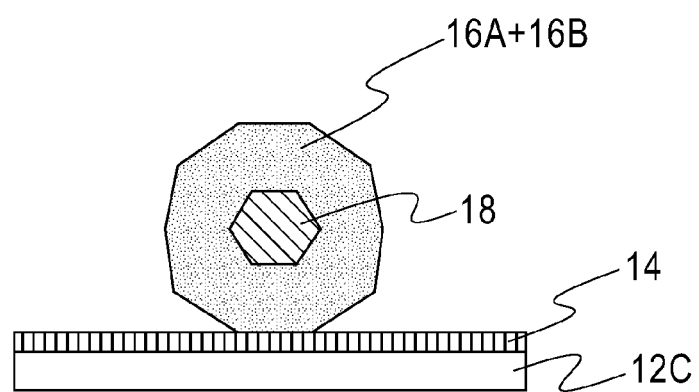
FIG. 5B is an orthogonal view through line A-A shown in FIG. 5A.

FIGS. 5A-5B illustrates the structure after the sacrificial spacer 26 is removed by conventional wet or dry etch chemistries to complete the gate patterning process.

The gate dielectric is etched off the semiconductor nanowires 18 (not shown) to expose the nanowire body in those regions where a source and drain are to be formed. Contacts are then made to the source, drain and gate utilizing techniques well known in the art to complete the device fabrication.

It is observed that the inventive method described above provides one embodiment for gate patterning of nano-channel devices which is performed without eroding the gate material around the nano-channels.

Figure 6A:
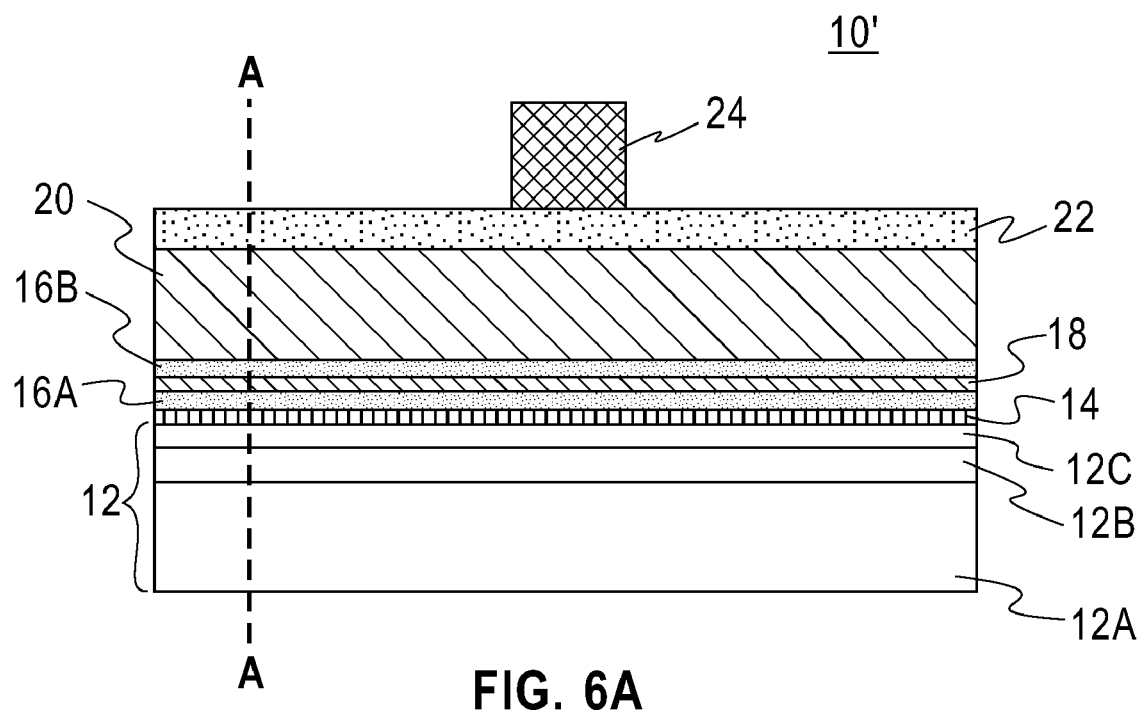
Figure 6B:
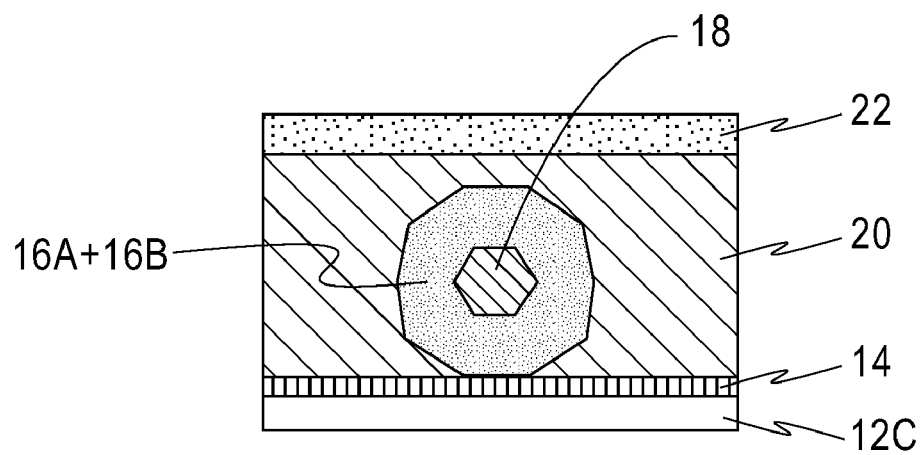
FIG. 6B is an orthogonal view through line A-A shown in FIG. 6A.

Reference is now made to FIGS. 6A-11B which illustrate a second embodiment for gate patterning of nano-channel devices. The second embodiment of the present invention utilizes a gate sidewall encapsulation and passivation process instead of the sacrificial spacer. The second embodiment of the invention includes providing the initial structure 10' shown in FIGS. 6A-6B. It is noted that the initial structure 10' shown in FIGS. 6A-6B is identical to the initial structure 10 shown in FIGS. 1A-1B. As such, the above description concerning the elements, reference numerals and processing steps used in providing the initial structure 10 shown in FIGS. 1A-1B are applicable here for providing the initial structure 10' shown in FIGS. 6A-6B.

Figure 7A:
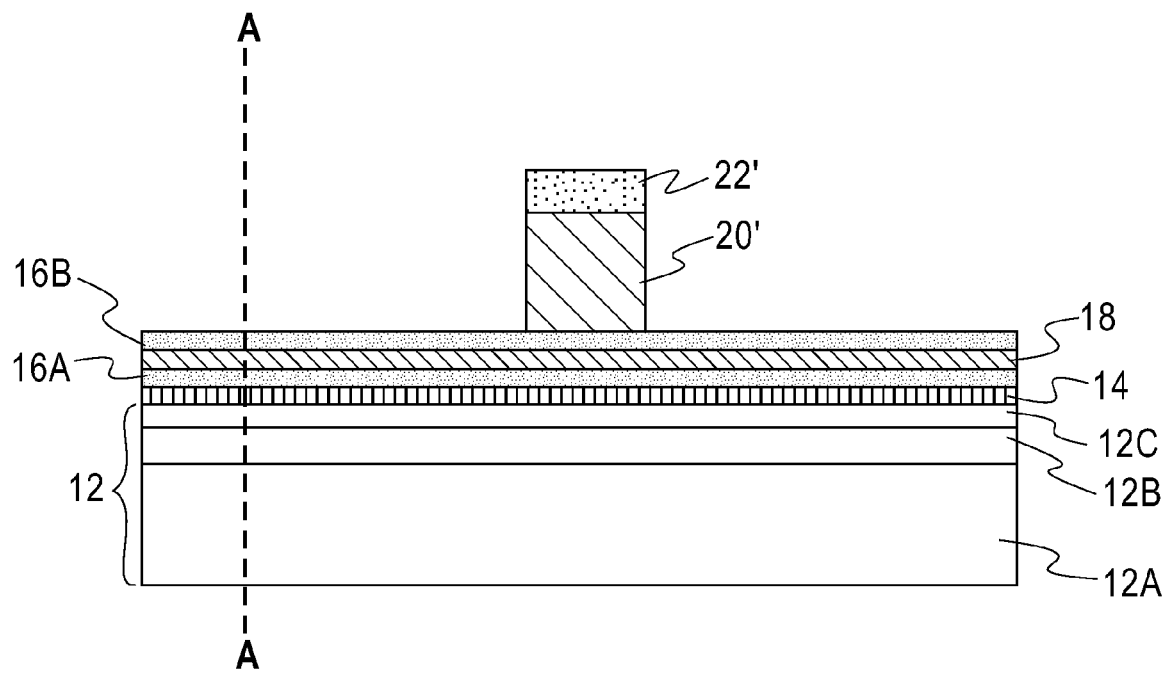
Figure 7B:
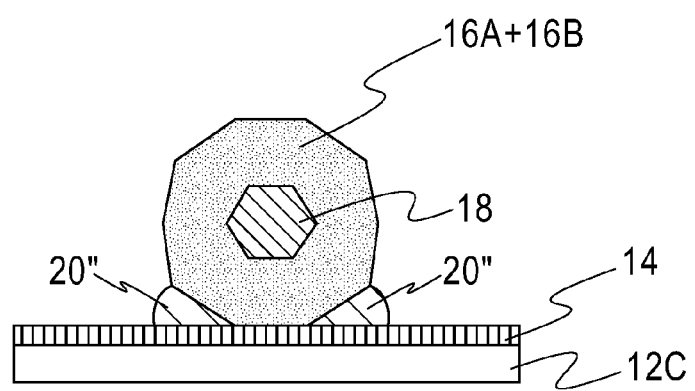
FIG. 7B is an orthogonal view through line A-A shown in FIG. 7A.

FIGS. 7A-7B show the structure that is formed after patterning the gate hard mask 22 and the gate conductor 20. It is observed that the gate patterning used here in FIGS. 7A-7B is identical to that used in providing the structure shown in FIGS. 2A-2B. It is further observed that stringers 20" remain under the NWs 18 after this gate patterning step and following the same an ion implantation process, as described above, can be used to change the etch rate of the stringers 20".

Figure 8A:
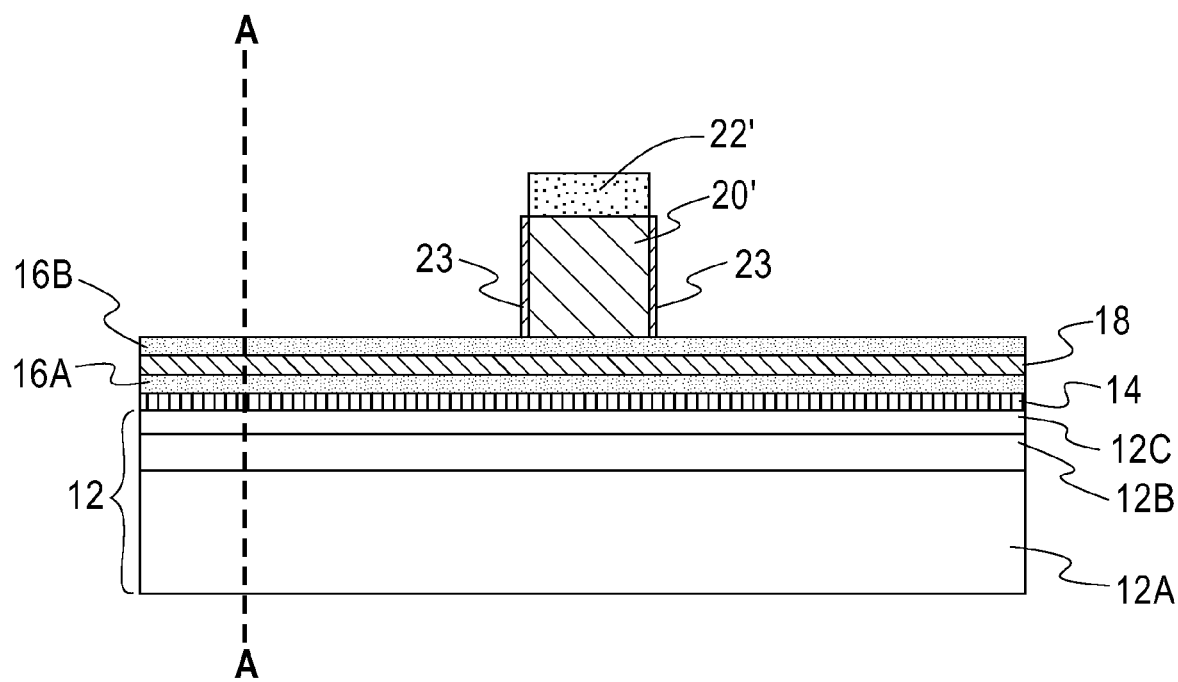
Figure 8B:
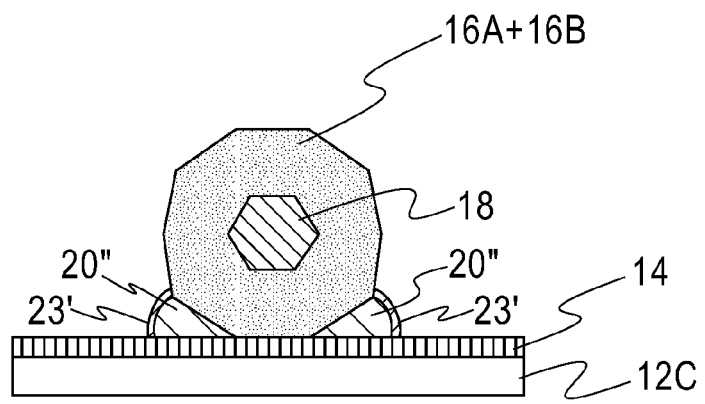
FIG. 8B is an orthogonal view through line A-A shown in FIG. 8A.

FIGS. 8A-8B illustrate the structure that is formed after performing a gate sidewall passivation process. The passivation layer that forms on the gate sidewalls is designated by reference numeral 23 in the drawings. The material of the passivation layer is dependent on the material of the gate conductor. For example, and when the gate conductor is comprised of polySi, then the passivation layer can comprise silicon dioxide or silicon nitride. The passivation layer that is formed typically has a thickness from 1 nm to 10 nm, with a thickness from 2 nm to 5 nm being even more typical. One method of forming the passivation layer is by exposing the patterned gate conductor 20' to an oxygen or nitrogen plasma at a temperature in the range between 200° C. and 300° C. Other techniques such as a thermal nitridation process which can form a passivation layer on the sidewalls of the gate conductor can also be employed in the present invention. It is observed that a passivation layer 23' also forms on the stringers 20" that are located beneath the NWs 18.

Figure 9A:
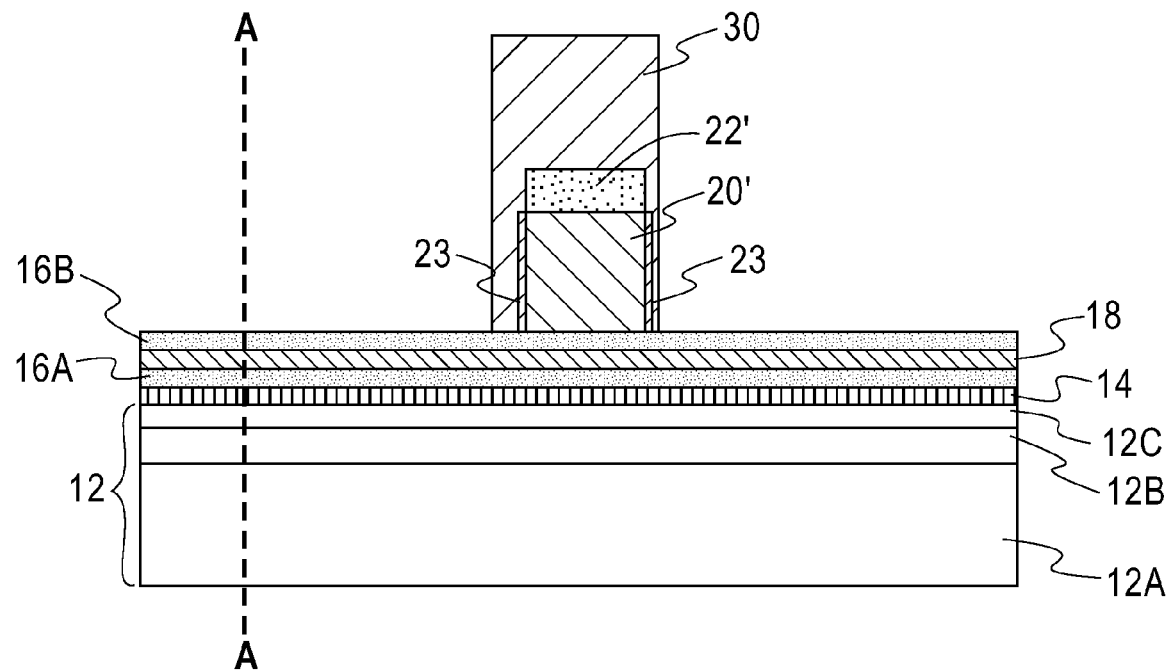
Figure 9B:
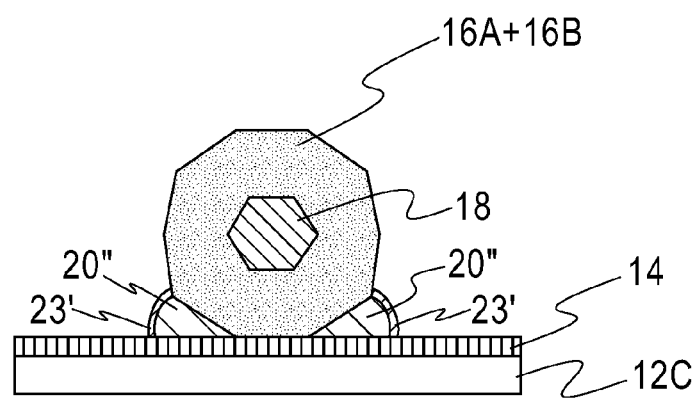
FIG. 9B is an orthogonal view through line A-A shown in FIG. 9A.

Next, a second gate mask 30 (the first being the patterned photoresist 24 used in forming the initial structure 10') is formed on the structure to provide the structure shown in FIGS. 9A-9B. As is illustrated, the second gate mask 30 is aligned to the patterned gate conductor 20' so that the second gate mask 30 overlaps the patterned gate conductor 20'. The second gate mask 30 also covers, e.g., encapsulates, the passivated sidewalls of the patterned gate conductor 20'. It is observed that the second gate mask 30 is aligned to the patterned gate conductor 20', but is not self-aligned.

Figure 10A:
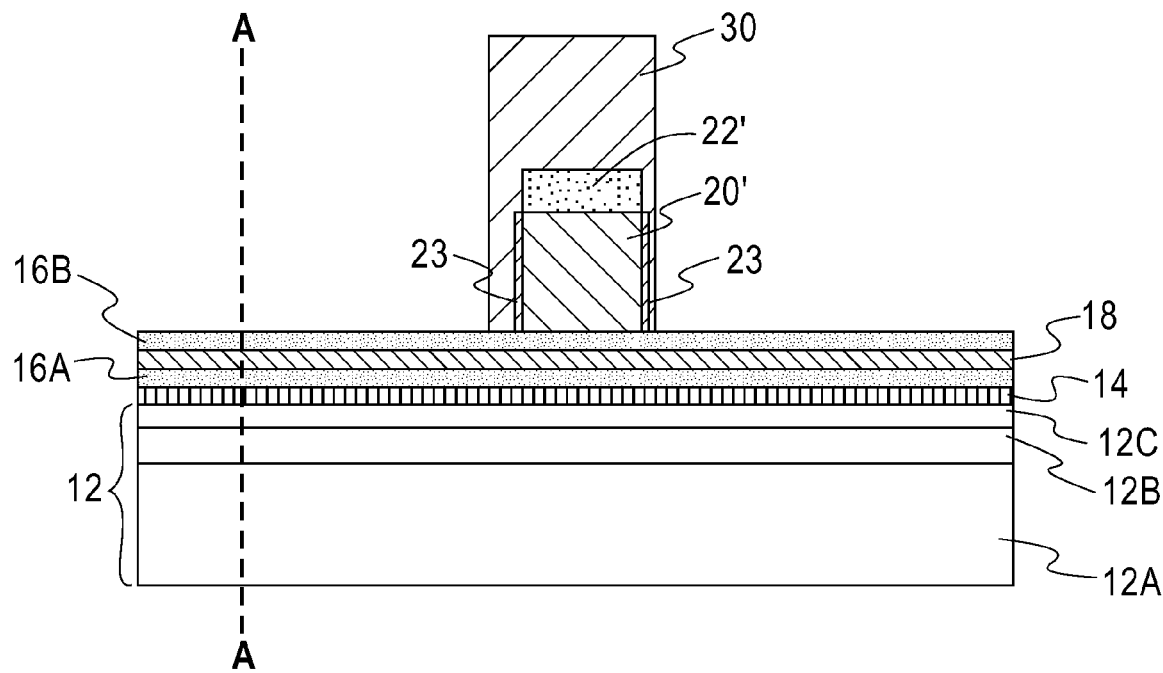
Figure 10B:
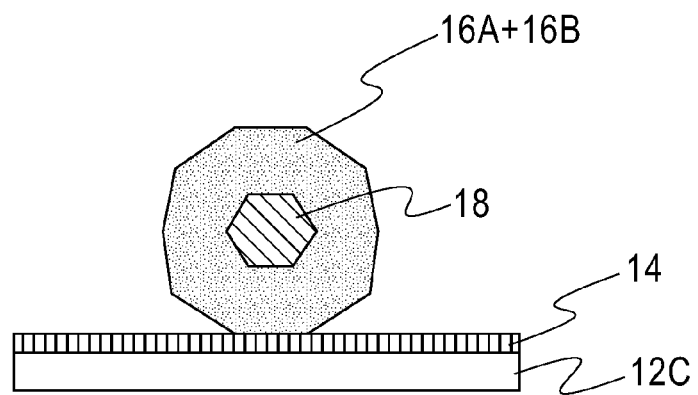
FIG. 10B is an orthogonal view through line A-A shown in FIG. 10A.

Referring to FIGS. 10A-10B, a two-step RIE process is used to remove the stringer 20". The first etch step consists of a non-selective directional etch that removes the passivation layer 23' from the stringers 20". This step is sometime referred to as a breakthrough etch. Passivation layer 23 is not removed from the sidewalls of patterned gate conductor 20' since it is covered by the second gate mask 30. When the patterned gate conductor 20' sidewalls are vertical the passivation layer 23 would not be etched off the sidewalls even in the absence of the second gate pattern mask 30 due to this etching step being very directional.

The second step consists of a selective and isotropic etch that attacks the stingers 20" but does not etch the passivation layer 23 or the second gate mask 30. As an example when poly-silicon is used as a gate conductor material, $SF_6$ based chemistry with negligible bias power can be used to etch poly-silicon selectively with respect to a passivation layer of oxide. In addition to $SF_6$ based chemistry, the second embodiment also can use the various etch chemistries as described above for the first embodiment of the invention. To obtain an isotropic etch, low bias and high gas pressure, as mentioned above in regard to the first embodiment, are typically employed. Due to the selectivity of the process with respect to the passivation layer and second gate mask 30 a large over etch of the stringers 20" can be practiced without the danger of attacking the patterned gate conductor 20'. The etch rate of stringers 20" is enhanced due to the previously performed ion-implantation. At the contact point between the stringers 20" and the patterned gate conductor 20' the lateral etching rate into the patterned gate conductor is slow since the bottom portion of the patterned gate conductor 20' is not implanted with ions.

Figure 11A:
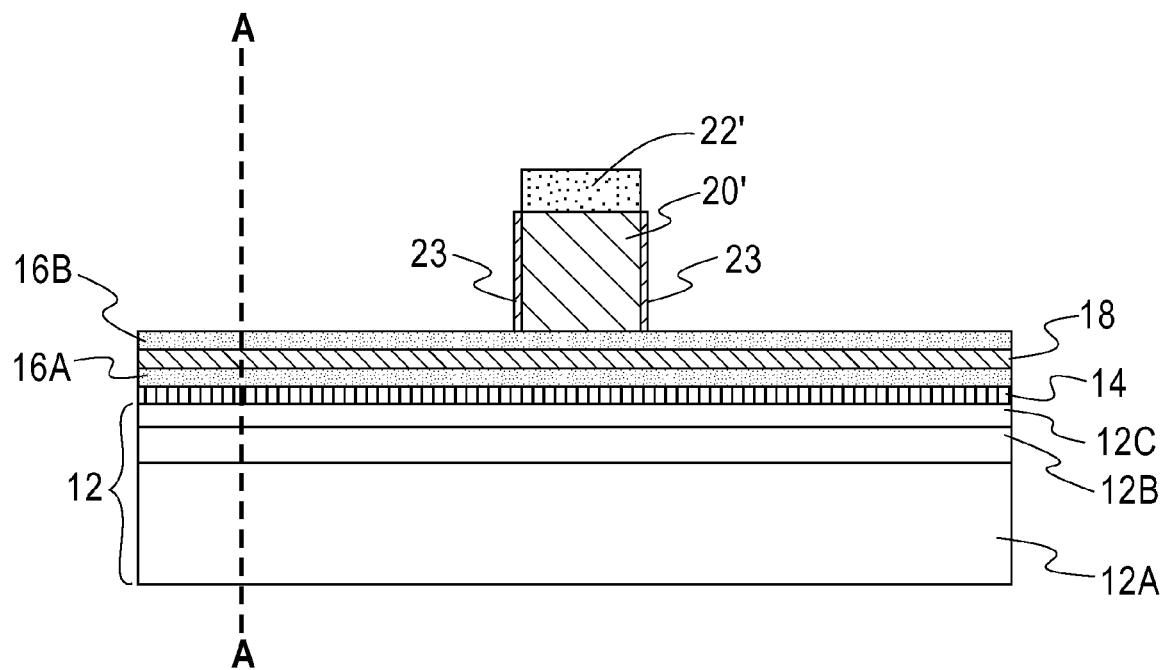
Figure 11B:
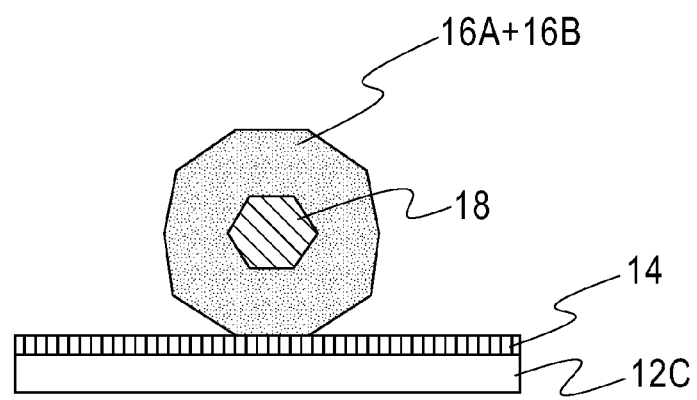
FIG. 11B is an orthogonal view through line A-A shown in FIG. 11.

Referring to FIGS. 11A-11B, the second gate mask 30 is stripped utilizing conventional techniques well known in the art including, for example, by oxygen plasma.

The gate dielectric is etched off the semiconductor nanowires 18 (not shown) to expose the nanowire body in those regions where a source and drain are to be formed. Contacts are then made to the source, drain and gate utilizing techniques well known in the art to complete the device fabrication.

It is observed that the inventive method represented by the second embodiment of this invention is also capable of gate patterning of nano-channel devices without eroding the gate material around the nano-channels.

Reference is now made to FIGS. 12A-15B which illustrate a third embodiment for gate patterning of nano-channel devices. The third embodiment of the present invention does not utilize a sacrificial spacer, as in the first embodiment, or a gate sidewall encapsulation and passivation process as used in the second embodiment. Instead, the third embodiment of the present invention utilizes an etch process that is free of oxygen and nitrogen to etch the gate conductor to a targeted depth, followed by a fluorine-based etch chemistry to etch residual gate material beneath the nano-channel while simultaneously and isotropically etching (i.e., trimming) the gate material to a final target dimension. In the third embodiment of the invention, the initial gate dimension is selected to be larger than the final target dimension.

Figure 12A:
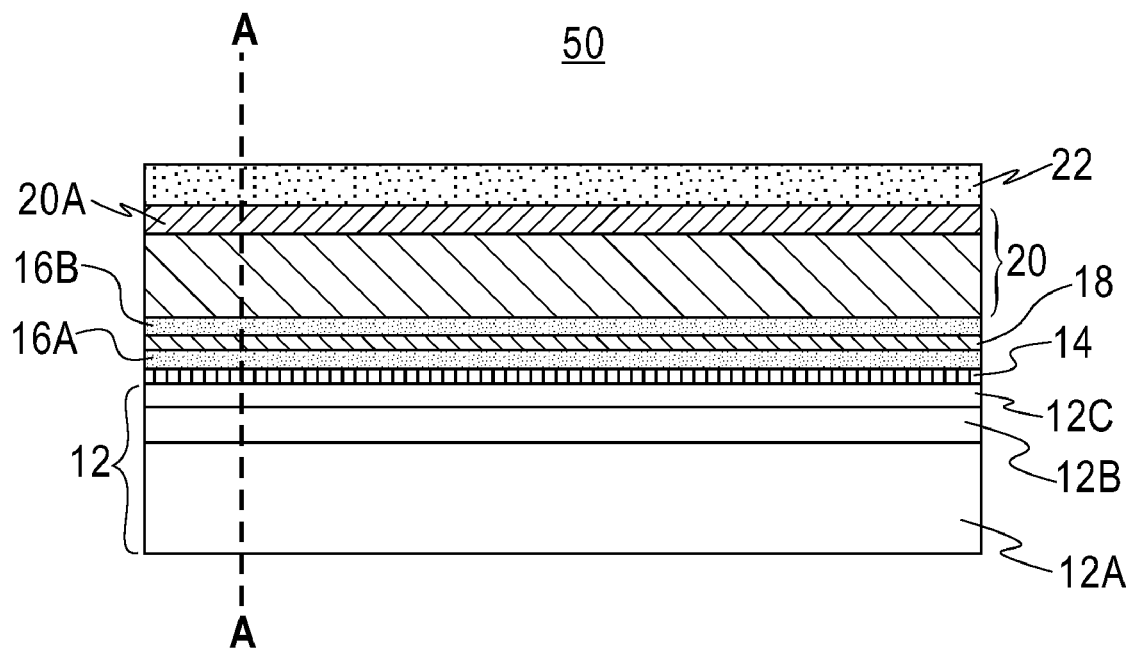
Figure 12B:
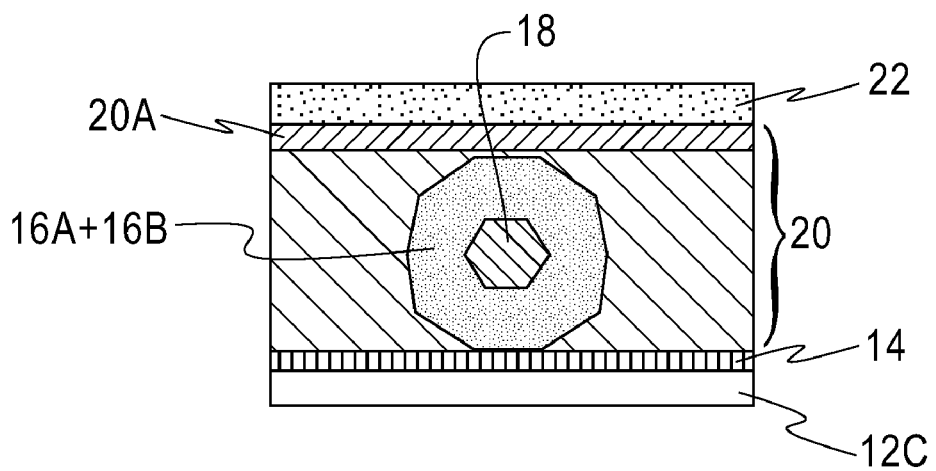
FIG. 12B is an orthogonal view through line A-A shown in FIG. 12A.

The third embodiment of the invention includes providing the initial structure 50 shown in FIGS. 12A-12B. It is noted that the initial structure 50 shown in FIGS. 12A-12B is essentially the same as the initial structure 10 shown in FIGS. 1A-1B except that patterned photoresist 24 is not yet present. Also, in the initial structure 50 shown in FIGS. 12A-12B, an upper portion of the gate conductor 20 has been doped with either an n-type impurity dopant or a p-type impurity dopant. The upper doped region of the gate conductor 20 is labeled as 20A in the drawings. Although FIG. 12A illustrates an embodiment in which predoping of the gate conductor 20 occurs, the third embodiment can also be practiced in instances in which the gate conductor 20 is not predoped. As such, predoping of the conductor 20 represents an optional step of the third embodiment of the present invention. The remaining elements shown in FIGS. 12A-12B which are the same as that shown in FIGS. 1A-1B have like reference numerals. As such, the above description concerning the like elements is applicable here for providing the initial structure 50 shown in FIGS. 12A-12B.

As mentioned in the proceeding paragraph, the gate conductor 20 may or may contain an optional doped region 20A located within an upper portion of the gate conductor 20. When present, the optional doped region is formed utilizing a doping process including, for example, gas phase doping, ion implantation, outdiffusion from an external doping layer and combinations thereof. In one embodiment, ion implantation is utilized in forming the doped region 20A within an upper portion of the gate conductor 20. The term "upper portion" of the gate conductor denotes a depth, as measured from an upper surface of the gate conductor 20, of from 10 nm to 50 nm, more typically within a range from 5 nm to 25 nm from an upper surface of the gate conductor 20. As mentioned above, the doped region 20A may include n-type impurity dopants such as an ion from Group VA of the Periodic Table of Elements, or p-type impurity dopants such as an ion from Group IIIA of the Periodic Table of Elements. The concentration of dopants within the doped region 20A may vary so long as it enhances the etch selectivity of the upper portion of the gate conductor 20 relative to the lower portion of the gate conductor 20. Typically, and by way of an example, the doped region 20A has a dopant concentration of $1\times10^{12}$ atoms/cm$^3$ or greater, with a dopant concentration from $1\times10^{12}$ to $1\times10^{16}$ atoms/cm$^{-3}$ being more typical. It is again emphasized that the doped region 20A is optional in the third embodiment of the present invention.

Figure 13A:
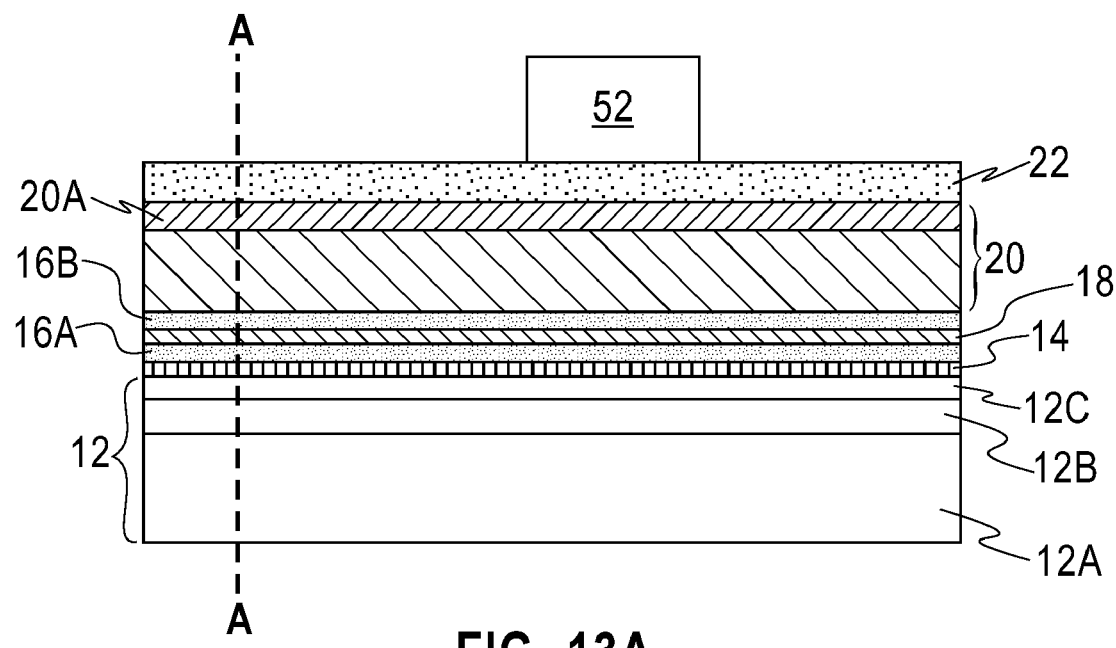
Figure 13B:
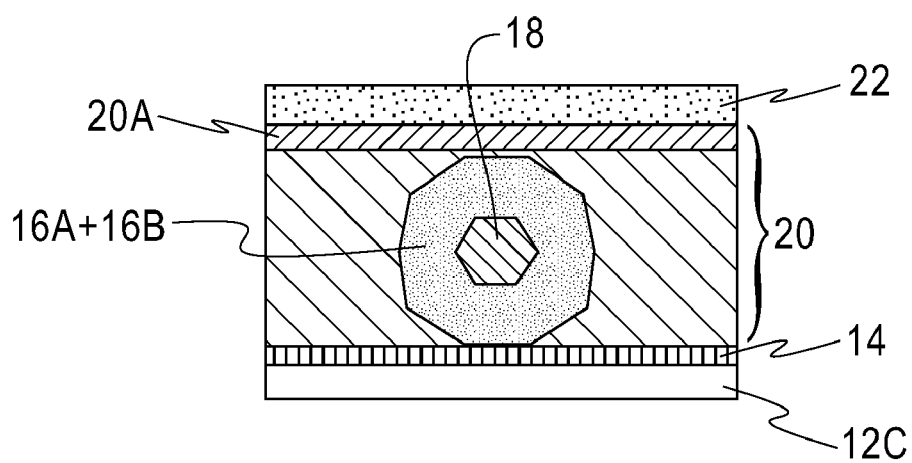
FIG. 13B is an orthogonal view through line A-A shown in FIG. 13A.

Next, and as illustrated in FIGS. 13A-13B, a patterned photoresist 52 is formed on an upper surface of the gate hard mask 22. The patterned photoresist 52 is formed as described above in respect to patterned photoresist 24; e.g., by deposition and lithography. Unlike patterned photoresist 24, patterned photoresist 52 has a post develop dimension that is larger than that targeted for the patterned (post etched) gate conductor 20. Typically, the post developed patterned photoresist 52 has a dimension from 40 nm to 65 nm, whereas the target critical dimension for the patterned gate conductor, e.g., electrode, is from 15 nm to 25 nm.

Figure 14A:
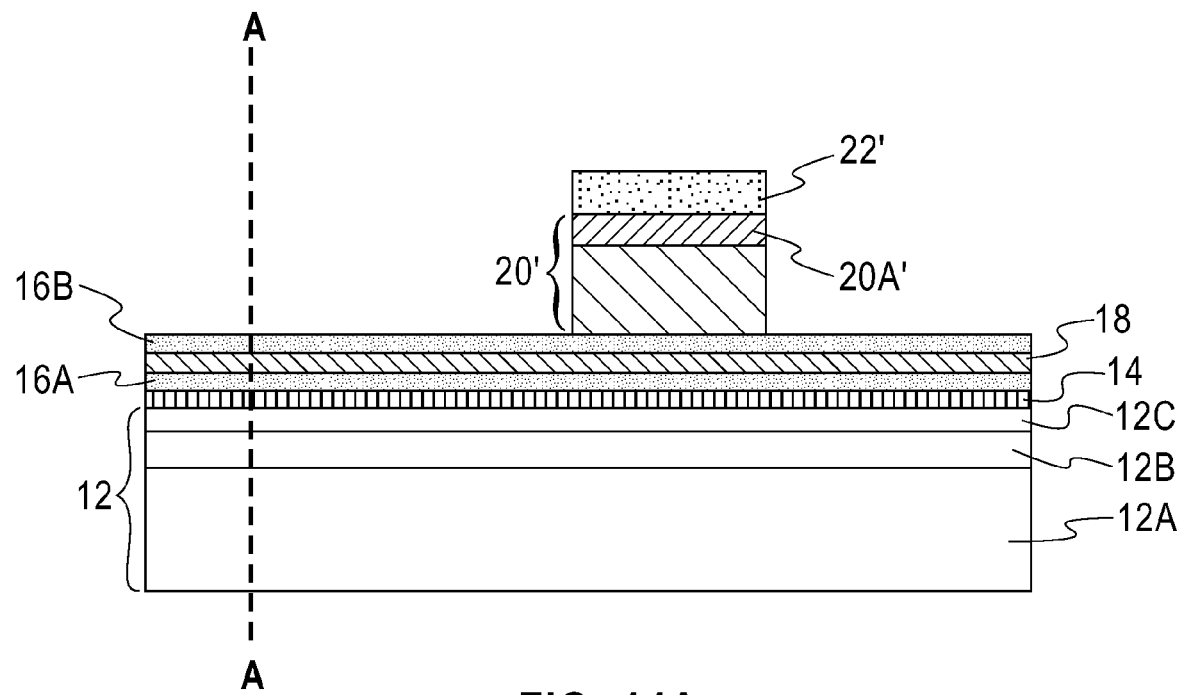
Figure 14B:
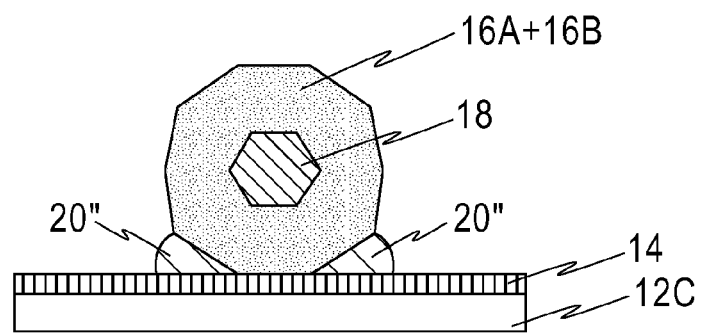
FIG. 14B is an orthogonal view through line A-A shown in FIG. 14A.

After providing the structure shown in FIGS. 13A-13B, the gate hard mask 22 and the gate conductor 20 are patterned forming a patterned gate hard mask 22' and a patterned gate conductor 20' atop the semiconductor nanowires 18 that are surrounded by the gate dielectric 16A and 16B, note, the dimension of the patterned gate conductor 20' is still larger than that targeted in the final patterned gate structure. The resultant structure that is formed is illustrated in FIGS. 14A-14B.

The patterning of the gate hard mask 22 and the gate conductor 20 is performed by performing one or more etching steps. The one or more etching steps include any etching process that does not include oxygen and nitrogen as an etchant species. Included within the etching processes are dry etching (i.e., reactive ion etching, plasma etching, ion beam etching or laser ablation) and/or wet chemical etching. Typically, two etching steps are employed, the first of which transfers the pattern from the patterned photoresist to the underlying gate hard mask, and the second of which transfers the pattern from the now patterned gate hard mask to the underlying gate conductor. It is observed that etching in a completely oxygen and nitrogen-free ambient so impedes the formation of a passivation layer.

At this stage, the at least one patterned gate conductor 20' has an effective gate length ranging from 40 nm to 65 nm, approximately 25 nm to 40 nm larger than a targeted dimension. Moreover, each patterned gate conductor 20' within the structure is typically separated from its nearest identical neighbor by a distance from 70 nm to 80 nm.

The patterned photoresist 52 can be removed immediately after transferring the pattern into the hard mask material or it can be removed after the pattern has been transferred to the underlying gate conductor. A conventional resist stripping process such as, for example, ashing, can be employed in removing the patterned photoresist from the structure. It is observed that after the aforementioned etching step, some of the gate conductor material remains beneath the semiconductor nanowires and the gate conductor critical dimension is still 25 nm to 40 nm larger than the 15 nm to 25 nm target.

The remaining gate conductor material beneath the NWs may also be referred to herein as a residue or stringer 20". The stringers 20" are connected to the patterned gate conductor. If left within the structure, the stringers 20" can lead to electrical shorts between the NWs and the patterned gate conductor when contacts (e.g., source and drain contacts) are formed to the body of each NW. As such, the stringers 20" need to be removed before the contacts are made to the body of each NW.

Figure 15A:
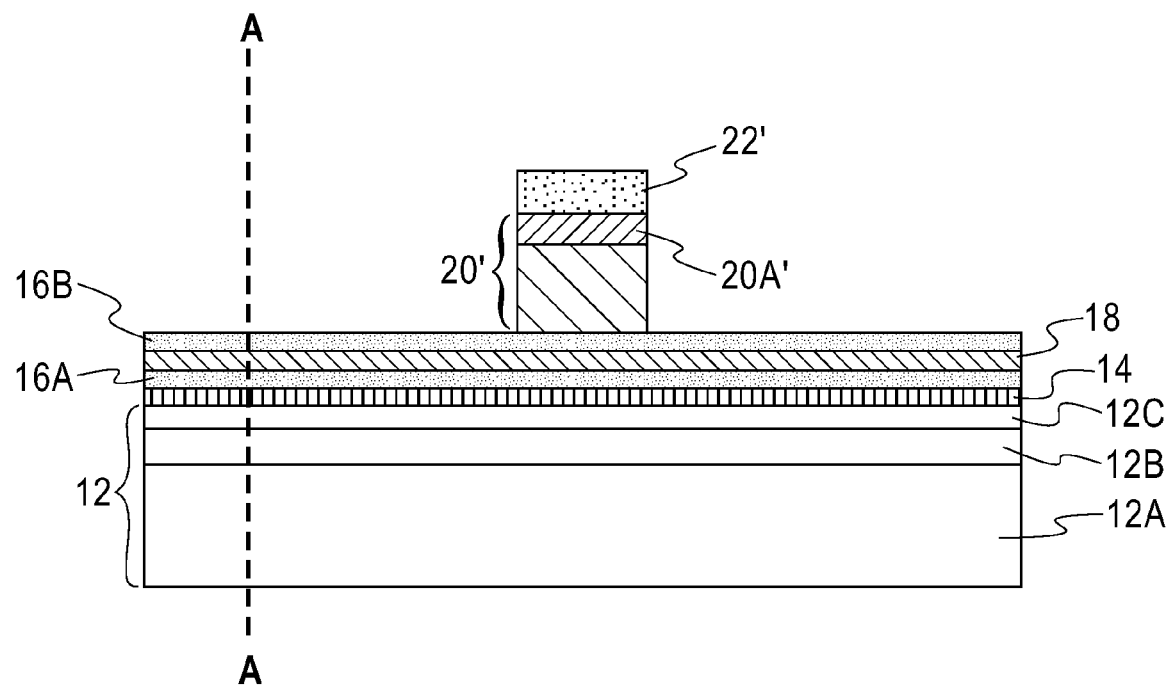
Figure 15B:
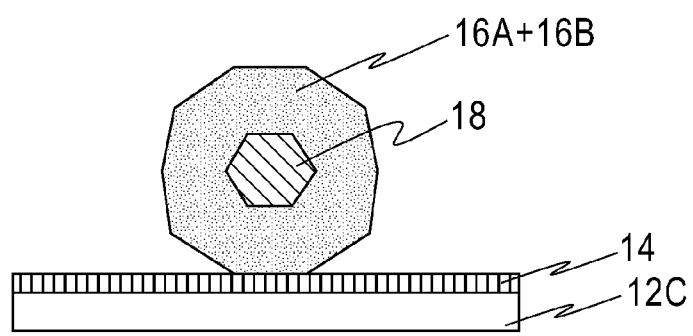
FIG. 15B is an orthogonal view through line A-A shown in FIG. 15A.

Next, as shown in FIGS. 15A-15B, an isotropic etch process (i.e., lateral etching) that is capable of etching the stringers 20" (i.e., the gate material that forms under the nanowires during patterning of the gate conductor) while simultaneously etching (trimming) the gate conductor in a uniform manner along the z-axis is employed. Since the volume of gate material beneath the NW is quasi-equivalent to that located in the gate conductor to be removed to achieve the target dimension (15 nm to 25 nm), knowing the etch rate of this material facilitates a timed etch process in which the above two materials are removed simultaneously to achieve the target structure in FIGS. 15A-15B.

This isotropic etch process is conducted on the same medium to high density plasma reactor as that used for the prior etching stages of the gate conductor, namely: inductively coupled, dual capacitively coupled, microwave, electron cyclotron resonance, helicon, or helical resonator.

An example of specific inventive plasma conditions employed for the isotropic etch process in the invention includes, but is not limited to pressures greater than or equal to 30 mT, negligible or no substrate bias, source powers greater than or equal to 150 W (plasma density typically between $10^{10}$ cm$^{-3}$ to $10^{12}$ cm$^{-3}$), F-containing chemistries, respectively including $SF_6$, $CF_4$, $XeF_2$ or combinations thereof.

Following the isotropic etching process, a conventional wet chemical etching process can be employed to remove material from the exposed surface of the substrate.

The gate dielectric is etched off the semiconductor nanowires (not shown) to expose the nanowire body in those regions where a source and drain are to be formed. Contacts are then made to the source, drain and gate utilizing techniques well known in the art to complete the device fabrication.

It is observed that the third embodiment of the invention as described above also provides a methodology for gate patterning of nano-channel devices which is performed without eroding the gate material around the nano-channels and patterning the gate conductor (electrode) to target dimension.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:
   providing at least one patterned gate conductor atop semiconductor nanowires that are surrounded by a gate dielectric, wherein residue gate material is present beneath the semiconductor nanowires;
   forming a protective material on at least exposed sidewalls of said at least one patterned gate conductor; and
   selectively removing the residue gate material that is present beneath the semiconductor nanowires utilizing an isotropic etching process, wherein prior to said isotropic etching process ions are implanted into the residue gate material that is located beneath the semiconductor nanowires.

2. The method of claim 1 wherein said semiconductor nanowires are formed by a process including forming a semiconductor material, lithography to define dimensions of the semiconductor nanowires and etching.

3. The method of claim 1 wherein said semiconductor nanowires are formed by employing a metal catalyst, precursor and dopant.

4. The method of claim 1 wherein said protective material is a sacrificial spacer.

5. The method of claim 1 wherein said protective material includes an encapsulation layer and a passivation layer.

6. The method of claim 1 wherein said isotropic etching includes F-containing chemistries or F- and Cl-containing chemistries.

7. The method of claim 1 wherein said isotropic etching is performed at a pressure greater than or equal to 30 mT using source powers greater than or equal to 150 W.

8. The method of claim 1 further comprising a non-selective directional etching process that is performed prior to said isotropic etching process.

9. A method of fabricating a semiconductor structure comprising:
   providing at least one patterned gate conductor of a first dimension atop semiconductor nanowires that are surrounded by a gate dielectric, wherein residue gate material is present beneath the semiconductor nanowires and said providing the at least one patterned gate conductor includes etching in an oxygen and nitrogen-free ambient; and
   selectively removing the residue gate material that is present beneath the semiconductor nanowires utilizing an isotropic etching process while simultaneously etching the at least one patterned gate conductor to a second dimension that is smaller than the first dimension in a uniform manner.

10. The method of claim 9 wherein said semiconductor nanowires are formed by a process including forming a semiconductor material, lithography to define dimensions of the semiconductor nanowires and etching.

11. The method of claim 9 wherein said semiconductor nanowires are formed by employing a metal catalyst, precursor and dopant.

12. The method of claim 9 wherein said isotropic etching includes F-containing chemistries.

13. The method of claim 12 wherein said F-containing chemistries include $XeF_2$, $SF_6$, $CF_4$ or combinations thereof.

14. The method of claim 9 wherein said isotropic etching is performed at a pressure greater than or equal to 30 mT using source powers greater than or equal to 150 W.

15. The method of claim 9 wherein said first dimension ranges from 40 to 65 nm and said second dimension ranges from 15 nm to 25 nm.

16. The method of claim 9 wherein each patterned gate conductor is separated from its nearest neighbor by a distance from 70 nm to 80 nm.

17. The method of claim 9 further comprising doping an upper portion a blanket layer of gate conductor prior to etching in the oxygen and nitrogen-free ambient.

18. The method of claim 17 wherein said doping includes ion implantation.

* * * * *